United States Patent
Rui et al.

(10) Patent No.: US 7,677,898 B2
(45) Date of Patent: Mar. 16, 2010

(54) PATCH PANEL AND PATCH PANEL CONNECTOR

(75) Inventors: Yi Rui, Shenzhen (CN); Ai-Yu Pan, Shenzhen (CN); Jian-She Shen, Shenzhen (CN); Mei Huang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/023,008

(22) Filed: Jan. 30, 2008

(65) Prior Publication Data

US 2009/0170348 A1 Jul. 2, 2009

(30) Foreign Application Priority Data

Dec. 28, 2007 (CN) .................... 2007 1 0203514

(51) Int. Cl.
H01R 29/00 (2006.01)
(52) U.S. Cl. .................................... 439/49
(58) Field of Classification Search .............. 379/59, 379/58; 714/712; 439/49
See application file for complete search history.

(56) References Cited

U.S. PATENT DOCUMENTS

| | | | | |
|---|---|---|---|---|
| 5,400,391 A | * | 3/1995 | Emura et al. | 455/422.1 |
| 5,618,185 A | * | 4/1997 | Aekins | 439/76.1 |
| 2003/0226071 A1 | * | 12/2003 | Millar | 714/712 |
| 2007/0147278 A1 | * | 6/2007 | Millar | 370/315 |

* cited by examiner

Primary Examiner—Jean F Duverne
(74) Attorney, Agent, or Firm—Frank R. Niranjan

(57) ABSTRACT

An exemplary patch panel includes a printed circuit board having a plurality of signal terminals for connecting to two pairs of peripheral component interconnect express (PCI-E) X1 differential signal terminals of an I/O controller hub (ICH), an interface terminal of a high definition multimedia interface (HDMI), four pairs of differential signal terminals of the HDMI, four pairs of differential signal terminals of a graphic and memory controller hub (GMCH), one of another differential signal terminal of the GMCH, and two pairs of differential signal terminals of a PCI-E X16 slot. Therefore, the ICH is connected to the PCI-E X16 slot via the patch panel for supporting a PCI-E X1 card while the GMCH is connected to the HDMI via the patch panel. A patch panel connector is provided to mount the patch panel on a motherboard.

2 Claims, 3 Drawing Sheets

FIG. 1

PATCH PANEL AND PATCH PANEL CONNECTOR

BACKGROUND

1. Field of the Invention

The present invention relates to a patch panel and mating patch panel connector.

2. Description of Related Art

Conventionally, a graphic and memory controller hub (GMCH) is mounted on a motherboard to connect to a peripheral component interconnect express X16 (PCI-E X16) slot for supporting a PCI-E graphic card or to connect to a high definition multimedia interface (HDMI) for supporting a monitor. The GMCH is controlled by a special chipset to selectively connect to the PCI-E X16 slot and the HDMI. However, when the GMCH is connected to the HDMI via the chipset, users cannot use another expansion card such as a PCI-E X1 card mounted in the PCI-E X16 slot because the chipset can not recognize the PCI-E X1 card at this time.

What is needed is a patch panel which can be mounted on the motherboard via a patch panel connecter to support the HDMI and the PCI-E X1 expansion card concurrently.

SUMMARY

An exemplary patch panel includes a printed circuit board having first to twenty-sixth signal terminals defined on a first side thereof. The first to the thirteenth signal terminals are connected to the twentieth, twenty-fifth, twenty-sixth, twenty-third, twenty-fourth, eighteenth, nineteenth, seventeenth, sixteenth, fifteenth, fourteenth, twenty-first, and twenty-second signal terminals respectively. The second to the fifth signal terminals are arranged to connect to two pairs of PCI-E X1 differential signal terminals of an ICH, the first signal terminal is arranged to connect to an interface terminal of an HDMI, the sixth to the thirteenth signal terminals are arranged to connect four pairs of differential signal terminals of the HDMI, the fourth to the nineteenth, twenty-first, and twenty-second signal terminals are arranged to connect to four pairs of differential signal terminals of a GMCH, the twentieth signal terminal is arranged to connect to one of another differential signal terminal of the GMCH, and the twenty-third to the twenty-sixth signal terminals are connected to two pairs of differential signal terminals of a PCI-E X16 slot.

A patch panel connector mating with the patch panel includes first to thirty-seventh terminals, wherein the first terminal is arranged to connect to an interface terminal of an HDMI, the second to the fifth terminals are arranged to connect to two pairs of PCI-E X1 differential signal terminals of an ICH, the sixth to the thirteenth terminals are arranged to connect to four pairs of differential signal terminals of the HDMI, the fourteenth to the twenty-fifth terminals are arranged to connect to six pairs of differential signal terminals of a GMCH, and the twenty-sixth to the thirty-seventh terminals are arranged to connect to six pairs of differential signal terminals of a PCI-E X16 slot.

Other advantages and novel features of the present invention will become more apparent from the following detailed description of preferred embodiment when taken in conjunction with the accompanying drawings, in which:

BRIEF DESCRIPTION OF THE DRAWINGS

FIG. 1 is a schematic diagram of a patch panel connector in accordance with an embodiment of the present invention;

DETAILED DESCRIPTION

Figure 1:
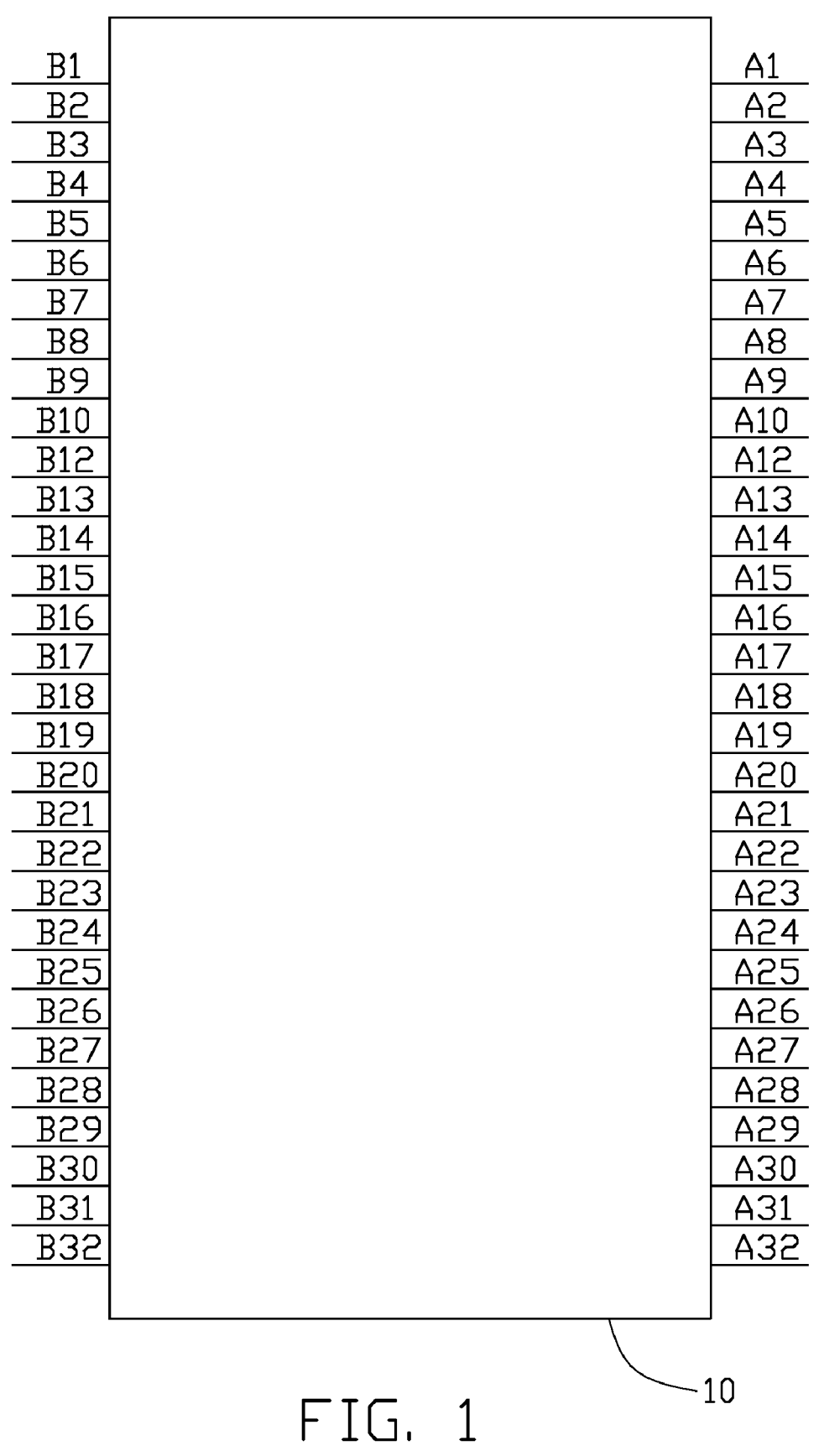

Referring to FIG. 1, a patch panel connector 10 in accordance with an embodiment of the present invention comprises sixty-four terminals A1~A32 and B1~B32. The terminal A1 is connected to an interface terminal of a high definition multimedia interface (HDMI). The terminals A3, A4, A6, and A7 are connected to two pairs of PCI-E X1 differential signal terminals HIS_N4/HIS_P4 and HSO_N4/HSO_P4 of an I/O controller hub (ICH) respectively. The terminals A9, A10, A13, A14, A16, A17, A19, and A20 are connected to four pairs of differential signal terminals PROTC_LANE0_DN/PROTC_LANE0_DP, PROTC_LANE1_DN/PROTC_LANE1_DP, PROTC_LANE2_DN/PROTC_LANE2_DP, and PROTC_CLK_DN/PROTC_CLK_DP of the HDMI respectively. The terminals A22, A23, A25, A26, A29, A30, B23, B24, B26, B27, B30, and B31 are connected to six pairs of differential signal terminals EXP_TXP0/EXP_TXN0, EXP_RXP0/EXP_RXN0, EXP_TXP1/EXP_TXN1, EXP_TXP3/EXP_TXN3, EXP_RXP3/EXP_RXN3, and EXP_TXP2/EXP_TXN2 of a graphic and memory controller hub (GMCH) respectively. The terminals B2, B3, B5, B6, B8, B9, B13, B14, B16, B17, B19, and B20 are connected to six pairs of differential signal terminals EXP_RXP0/EXP_RXN0, EXP_TXP0/EXP_TXN0, EXP_TXP1/EXP_TXN1, EXP_TXP2/EXP_TXN2, EXP_TXP3/EXP_TXN3, and EXP_RXP3/EXP_RXN3 of a peripheral component interconnect express X16 (PCI-E X16) slot respectively. The other terminals are grounded.

Figure 2:
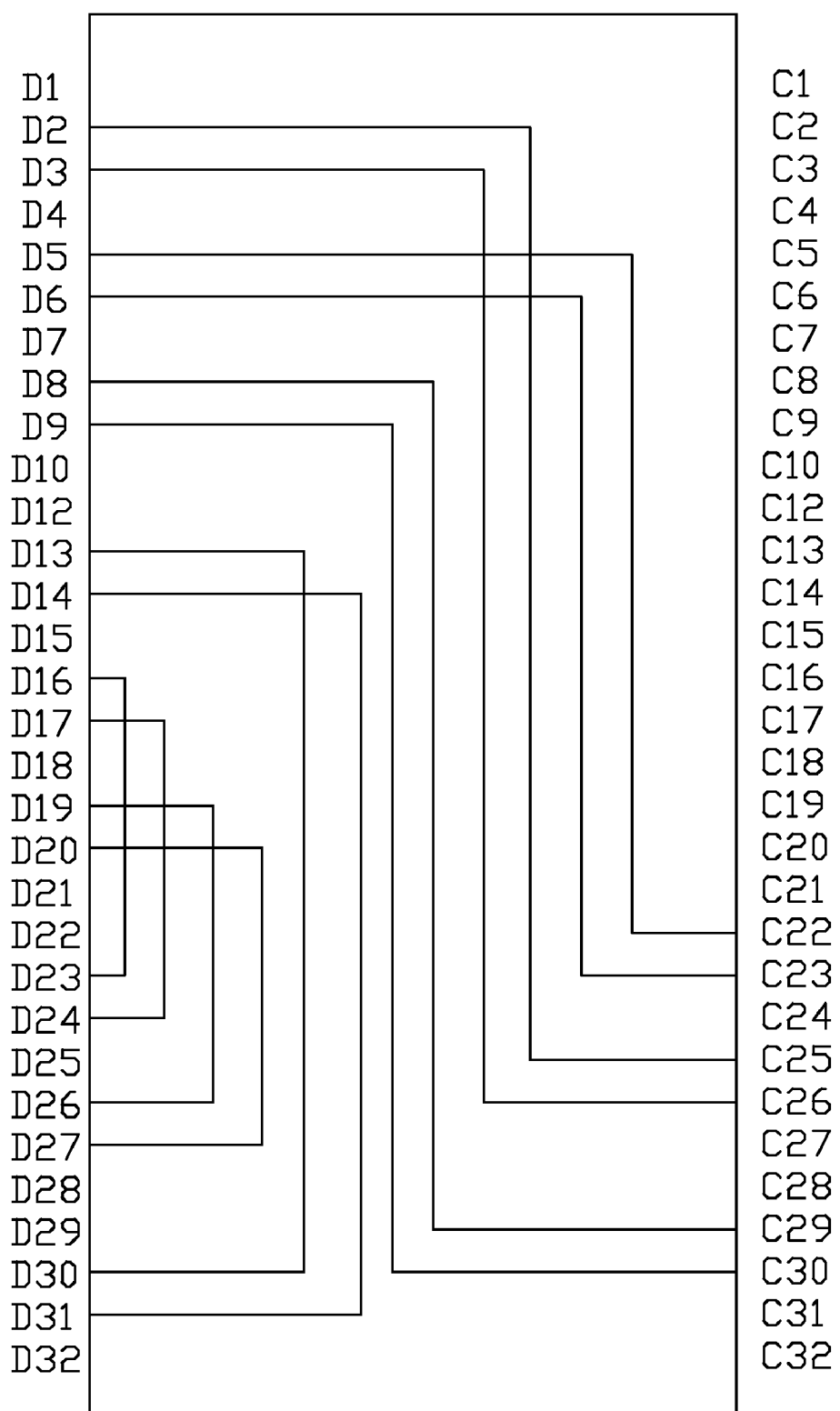
FIG. 2 is a circuit diagram of a first side of a patch panel in accordance with an embodiment of the present invention.

Referring to FIG. 2, a patch panel in accordance with an embodiment of the present invention comprises a printed circuit board defining sixty-four signal terminals C1~C32 and D1~D32 on a first side 20 thereof. The signal terminals C22, C23, C25, C26, C29, C30, D23, D24, D26, D27, D30, and D31 are connected to the signal terminals D5, D6, D2, D3, D8, D9, D16, D17, D19, D20, D13, and D14 respectively. The signal terminals C1~C32 and D1~D32 of the patch panel are connected to the terminals A1~A32 and B1~B32 of the patch panel connector 10 respectively when the first side 20 of the patch panel is mounted on the patch panel connector 10. Therefore, the differential signal terminals EXP_TXP0, EXP_TXN0, EXP_RXP0, EXP_RXN0, EXP_TXP1, EXP_TXN1, EXP_TXP3, EXP_TXN3, EXP_RXP3, EXP_RXN3, EXP_TXP2, and EXP_TXN2 of the GMCH are connected to the differential signal terminals EXP_TXP0, EXP_TXN0, EXP_RXP0, EXP_RXN0, EXP_TXP1, EXP_TXN1, EXP_TXP3, EXP_TXN3, EXP_RXP3, EXP_RXN3, EXP_TXP2, and EXP_TXN2 of the PCI-E X16 slot respectively when the first side 20 of the patch panel is mounted on the motherboard via the patch panel connector 10.

Figure 3:
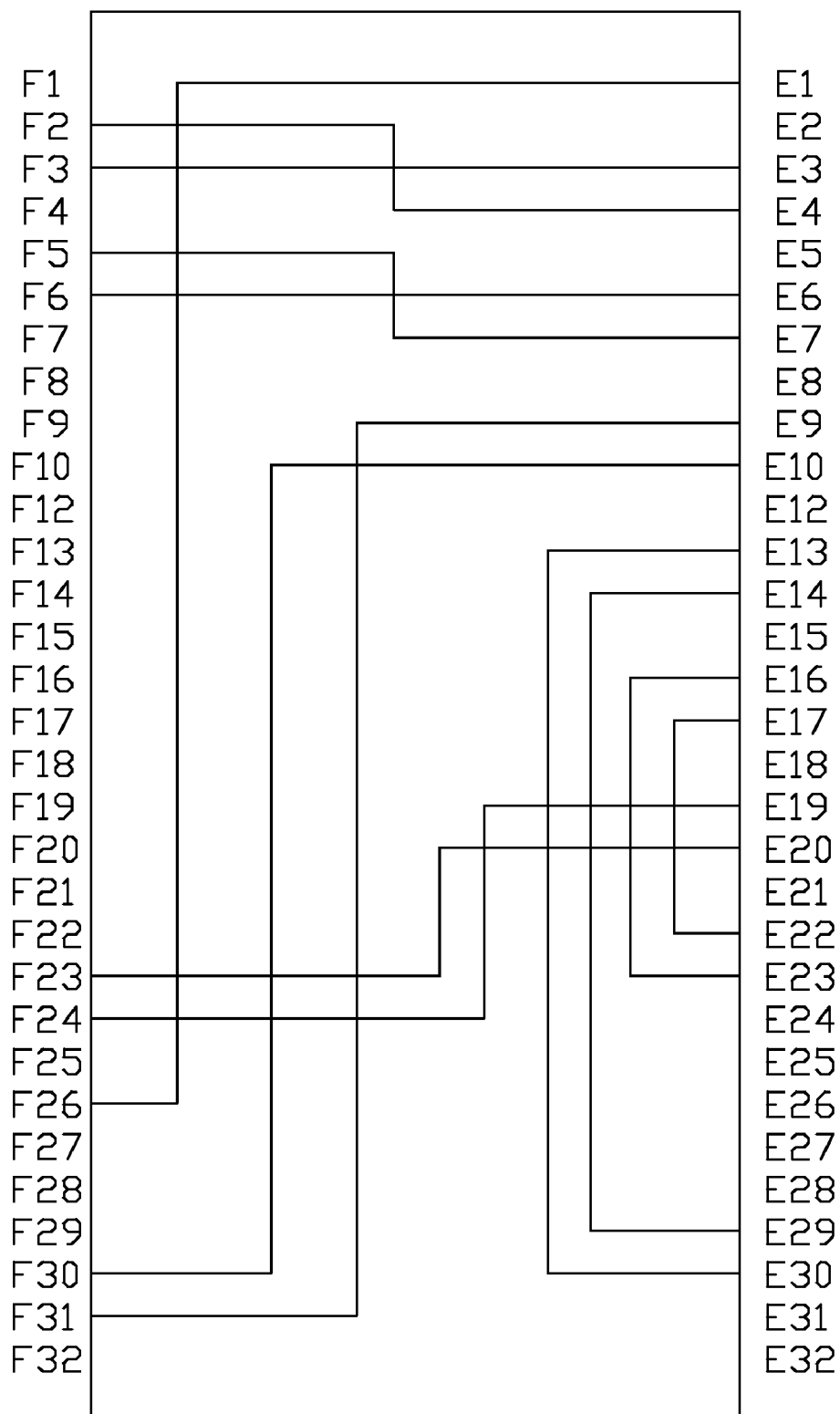
FIG. 3 is a circuit diagram of a second side of the patch panel of FIG. 2.

Referring to FIG. 3, a second side 30 of the patch panel defines sixty-four signal terminals E1~E32 and F1~F32, wherein the signal terminals E1, E3, E4, E6, E7, E9, E10, E13, E14, E16, E17, E19, and E20 are connected to the signal terminals F26, F3, F2, F6, F5, F31, F30, E30, E29, E23, E22, F24, and F23 respectively. The signal terminals E1~E32 and F1~F32 of the patch panel are connected to the terminals A1~A32 and B1~B32 of the patch panel connector 10 respectively when the first side 20 of the patch panel is mounted on the patch panel connector 10. Therefore, the interface terminal HDMI_HDP_MUX and the differential signal terminals PROTC_LANE0_DN, PROTC_LANE0_DP, PROTC_LANE1_DN, PROTC_LANE1_DP, PROTC_LANE2_DN, PROTC_LANE2_DP, PROTC_CLK_DN, and PROTC_CLK_DP of the HDMI are connected to the differential signal terminals EXP_RXP3, EXP_TXN2, EXP_TXP2, EXP_TXN1, EXP_TXP1, EXP_TXN0, EXP_TXP0, EXP_TXN3, and EXP_TXP3 of the GMCH respectively, and the PCI-E X1 differential signal terminals HIS_N4, HIS_P4, HSO_N4, and HSO_P4 of the ICH are connected to the differential signal terminals EXP_RXN0, EXP_RXP0, EXP_TXN0, and EXP_TXP0 of the PCI-E X16 slot respectively, when the second side 30 of the patch panel is mounted on the motherboard via the patch panel connector 10.

Operators can selectively mount one of the first side 20 and the second side 30 of the patch panel on the motherboard via the patch panel connector 10 for selectively connecting the GMCH to the PCI-E X16 slot, or connecting the GMCH to the HDMI and concurrently connecting the ICH to the PCI-E X16 to support a PCI-E X1 card.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A patch panel operable to a motherboard comprising an I/O controller hub (ICH), a high definition multimedia interface (HDMI), a graphic and memory controller hub (GMCH), and a peripheral component interconnect express (PCI-E) X16 slot, the patch panel comprising a printed circuit board having first to twenty-sixth signal terminals defined on a first side thereof and twenty-seventh to fiftieth signal terminals defined on a second side thereof, wherein the first to thirteenth signal terminals are connected to the twentieth, twenty-fifth, twenty-sixth, twenty-third, twenty-fourth, eighteenth, nineteenth, seventeenth, sixteenth, fifteenth, fourteenth, twenty-first, and twenty-second signal terminals respectively, the twenty-seventh to thirty-eighth signal terminals are connected to the forty-eighth, forty-seventh, fiftieth, forty-ninth, forty-sixth, forty-fifth, forty-third, forty-fourth, thirty-ninth, fortieth, forty-first, and forty-second signal terminals respectively, wherein when the first side of the printed circuit board is mounted on the motherboard, the second to the fifth signal terminals are connected to two pairs of PCI-E X1 differential signal terminals of the ICH, the first signal terminal is connected to an interface terminal of the HDMI, the sixth to the thirteenth signal terminals are connected to four pairs of differential signal terminals of the HDMI, the fourth to the nineteenth, twenty-first, and twenty-second signal terminals are connected to four pairs of differential signal terminals of the GMCH, the twentieth signal terminal is connected to one of another differential signal terminal of the GMCH, and the twenty-third to the twenty-sixth signal terminals are connected to two pairs of differential signal terminals of the PCI-E X16 slot, so that the GMCH is connected to the HDMI and concurrently the ICH is connected to the PCI-E X16 slot; wherein when the second side of the printed circuit board is mounted on the motherboard, the twenty-seventh to the thirty-eighth signal terminals are connected to six pairs of differential signal terminals of the GMCH, and the thirty-ninth to the fiftieth signal terminals are connected to six pairs of differential signal terminals of the PCI-E X16 slot, so that the GMCH is connected to the PCI-E X16 slot.

2. A patch panel connector operable to mount the first or second side of the printed circuit board of the patch panel on the motherboard as claimed in claim 1, the patch panel connector comprising first to thirty-seventh terminals, wherein the first terminal is arranged to connect to an interface terminal of the HDMI, the second to the fifth terminals are arranged to connect to two pairs of PCI-E X1 differential signal terminals of the ICH, the sixth to the thirteenth terminals are arranged to connect to four pairs of differential signal terminals of the HDMI, the fourteenth to the twenty-fifth terminals are arranged to connect to six pairs of differential signal terminals of the GMCH, and the twenty-sixth to the thirty-seventh terminals are arranged to connect to six pairs of differential signal terminals of the PCI-E X16 slot.

* * * * *